| 
US008854131B2

(12) United States Patent
Franchini et al.

(10) Patent No.: US 8,854,131 B2
(45) Date of Patent: Oct. 7, 2014

(54) ACTIVE TRANSDUCER PROBES AND CIRCUITS

(71) Applicant: MAXIM Integrated Products, Inc., Sunnyvale, CA (US)

(72) Inventors: Luigi Franchini, Rimini (IT); Diego Maiocchi, Milan (IT); Roberto Amadio, Celle Ligure (IT)

(73) Assignee: MAXIM Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/920,073

(22) Filed: Jun. 17, 2013

(65) Prior Publication Data

US 2014/0015605 A1      Jan. 16, 2014

Related U.S. Application Data

(62) Division of application No. 12/876,162, filed on Sep. 5, 2010, now Pat. No. 8,465,432.

(51) Int. Cl.
*H03F 1/52*        (2006.01)
*H03F 1/02*        (2006.01)
*H03F 3/72*        (2006.01)

(52) U.S. Cl.
CPC ......... *H03F 1/52* (2013.01); *H03F 2203/7236* (2013.01); *H03F 1/0088* (2013.01); *H03F 2200/261* (2013.01); *H03F 2203/7221* (2013.01); *H03F 1/0277* (2013.01); *H03F 3/72* (2013.01); *H03F 2203/7215* (2013.01)
USPC ............................................ 330/151; 300/51

(58) Field of Classification Search
USPC ................. 330/51, 278–279, 254, 9; 342/124
See application file for complete search history.

(56) References Cited

U.S. PATENT DOCUMENTS 8,405,542 B2 *   3/2013   Corbe et al. ................... 342/124

* cited by examiner

*Primary Examiner* — Hieu Nguyen
(74) *Attorney, Agent, or Firm* — TIPS Group (57) ABSTRACT

In an example embodiment, a method for bidirectional signal propagation comprises: a) sensing a voltage level of a first signal at a first port; b) coupling the first port to an output of an amplifier with a solid state switch if the voltage level of the first signal is less than a threshold voltage, whereby a second signal applied to a second port coupled to an input of the amplifier is propagated in a first direction from the second port to the first port; and c) bypassing the amplifier if the voltage level of the first signal is greater than the threshold voltage such that the first signal is propagated in a second direction from the first port to the second port.

10 Claims, 8 Drawing Sheets

ACTIVE TRANSDUCER PROBES AND CIRCUITS

CROSS REFERENCE TO RELATED APPLICATION

This application is a division of U.S. Ser. No. 12/876,162, filed Sep. 5, 2010, which is incorporated herein by reference.

BACKGROUND

Transducer probes are used, for example, for diagnostic sonography or "ultrasonography." Diagnostic ultrasonography is an ultrasound-based diagnostic imaging technique used to visualize subcutaneous body structures including tendons, muscles, joints, vessels and internal organs for possible pathology or lesions. Obstetric ultrasonography is commonly used during pregnancy and is widely recognized by the public.

In physics, the term "ultrasound" applies to acoustic energy (longitudinal mechanical compression waves) with a frequency above the audible range of human hearing. The audible range of sound is generally considered to be about 20 hertz-20 kilohertz. Therefore, ultrasound is commonly considered to be frequencies greater than 20 kilohertz.

Ultrasonography uses a probe containing one or more acoustic transducers to send pulses of sound into a material. Whenever a sound wave encounters a material with a different density (acoustical impedance) part of the sound wave is reflected back to the probe and is detected as an echo. The time it takes for the echo to travel back to the probe is measured and used to calculate the depth of the tissue interface causing the echo. As a result, when the differences between the acoustical impedances become larger, so do the echoes.

The frequencies used for medical imaging are generally in the range of 1 to 18 MHz. Higher frequencies have a correspondingly smaller wavelength and can be used to make sonograms with smaller details. However, the attenuation of the sound wave is increased at higher frequencies so, in order to have better penetration of deeper tissues, a lower frequency range (e.g. 3-5 MHz) is often used.

A basic ultrasound machine includes a transducer probe (also known as a "probe head") and a "main frame" including a CPU, transducer pulse controls, display, storage, I/O, etc. The transducer probe, which sends and receives the sound waves, is a critical component of an ultrasound machine. The transducer probe generates and receives sound wave using the piezoelectric effect. More specifically, in the probe there are one or more quartz (piezoelectric) crystals. When an alternating electric current is applied to these crystals, they change shape rapidly creating ultrasonic waves. Conversely, when ultrasonic waves impinge upon the piezoelectric crystals they create alternating electric current. Therefore, the same crystals can be used to send and receive sound waves. The probe also has a sound absorbing substance to eliminate back reflections and an acoustic lens to help focus the emitted sound waves.

Figure 1:
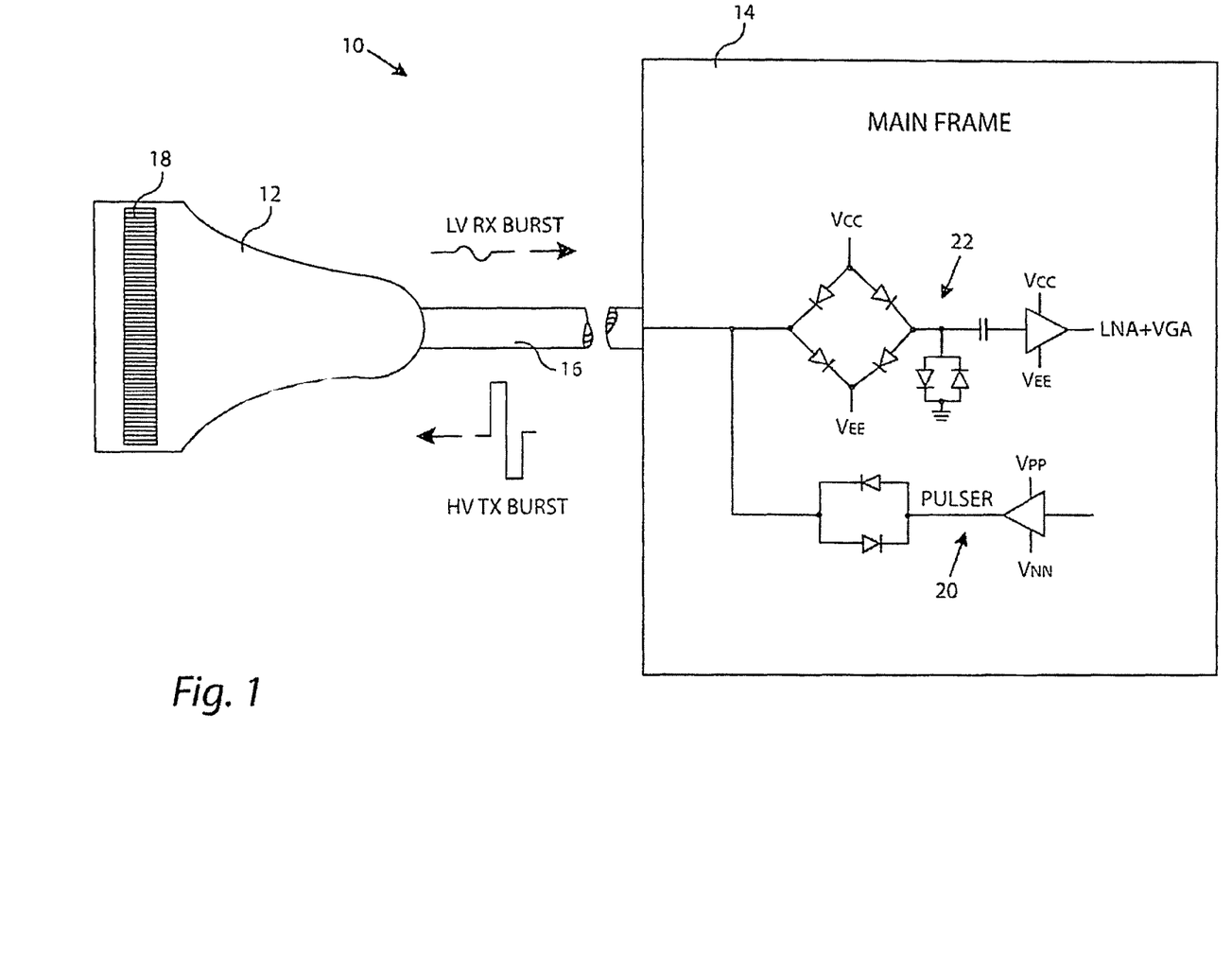
FIG. 1 depicts a typical prior art ultrasound machine.

A prior art ultrasound machine 10 is illustrated in FIG. 1 and includes a probe ("probe head") 12, a main frame 14 and a cable 16 connecting the probe 12 to the main frame 14. The probe 12 includes a piezoelectric transducer 18. The main frame 14 includes a "pulser" transmitter 20 and a receiver 22. The cables often include 100-200 insulated wires to support various channels of the ultrasonic probe and to carry power, ground and other signals. Each wire dedicated to a channel can carry both high voltage transmission signals (HV TX Bursts) from the transmitter 20 and low voltage receive signals (LV RX Bursts or "echoes") received by the receiver 22. The HV TX Bursts are typically 200 volts peak-to-peak, while the LV RX Bursts are typically no more than ±300 millivolts. Signals from the various channels are processed by the mainframe to create the ultrasound image.

Prior art commercial probes, such as probe 12, are generally passive, i.e. amplification has traditionally only been performed in the main frame 14. Furthermore, the probe 12 is not typically impedance matched to the cable 16. Most probes have an impedance of 300-500Ω while cables have an impedance of about 75Ω. This results in a high amount of attenuation of the LV RX signals, a high signal-to-noise ratio (SNR) and signal reflection problems.

Amplification has not been used in commercial ultrasonic probes for a variety of reasons. For one, the high voltage bursts from the mainframe transmitter can be very damaging to delicate semiconductor devices such as operational amplifiers. For another, there are severe space and power restrictions in probes heads. That is, because the probes are hand-held and are pressed against the skin, they cannot be made too large, nor can they generate too much heat. The size and heat generation of electronic circuitry is contrary to these requirements. Also, any probe with amplification would have to remain compatible with standard ultrasound machines, complicating design choices.

These and other limitations of the prior art will become apparent to those of skill in the art upon a reading of the following descriptions and a study of the several figures of the drawing.

SUMMARY

In an example embodiment, a bidirectional multichannel circuit comprises a first plurality of channel ports, a second plurality of channel ports, and channel circuitry coupling the first plurality of channel ports to the second plurality of channel ports to provide a plurality of active channels. In this example embodiment, each active channel includes: a) an amplifier having an input and an output; b) an amplifier output protector including a solid state switch coupling the output of the amplifier to a channel port of the first plurality of channel ports, the solid state switch having an open position and a closed position; and c) a controller coupled to the channel port of the first plurality of channel ports and to the amplifier output protector. The controller is thereby operative to control the solid state switch of the amplifier output protector.

In another example embodiment, a method for bidirectional signal propagation comprises: a) sensing a voltage level of a first signal at a first port; b) coupling the first port to an output of an amplifier with a solid state switch if the voltage level of the first signal is less than a threshold voltage, whereby a second signal applied to a second port coupled to an input of the amplifier is propagated in a first direction from the second port to the first port; and c) bypassing the amplifier if the voltage level of the first signal is greater than the threshold voltage such that the first signal is propagated in a second direction from the first port to the second port.

In yet another example embodiment, an active ultrasonic probe comprises a housing and a multichannel transducer and a bidirectional multichannel circuit disposed within the housing. In this example, the bidirectional multichannel circuit includes: a) a first plurality of channel ports; b) a second plurality of channel ports which are coupled to the multichannel transducer; and c) channel circuitry coupling the first plurality of channel ports to the second plurality of channel ports to provide a plurality of active channels. In this example, each active channel includes: i) an amplifier having an input coupled to one of the second plurality of channel ports and an output; ii) an amplifier output protector including a solid state switch coupling the output of the amplifier to a channel port of the first plurality of channel ports, the solid state switch having an open position and a closed position; and iii) a controller coupled to the channel port of the first plurality of channel ports and to the amplifier output protector.

In an embodiment, a probe head is provided with a high-voltage protected amplifier which improves SNR. In an embodiment, impedance matching between a probe head and a transmission cable is achieved reducing attenuation and reflection. In an embodiment, an active probe head is compatible with standard probes such that it can be used with standard ultrasound machines.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTIONS

Figure 2:
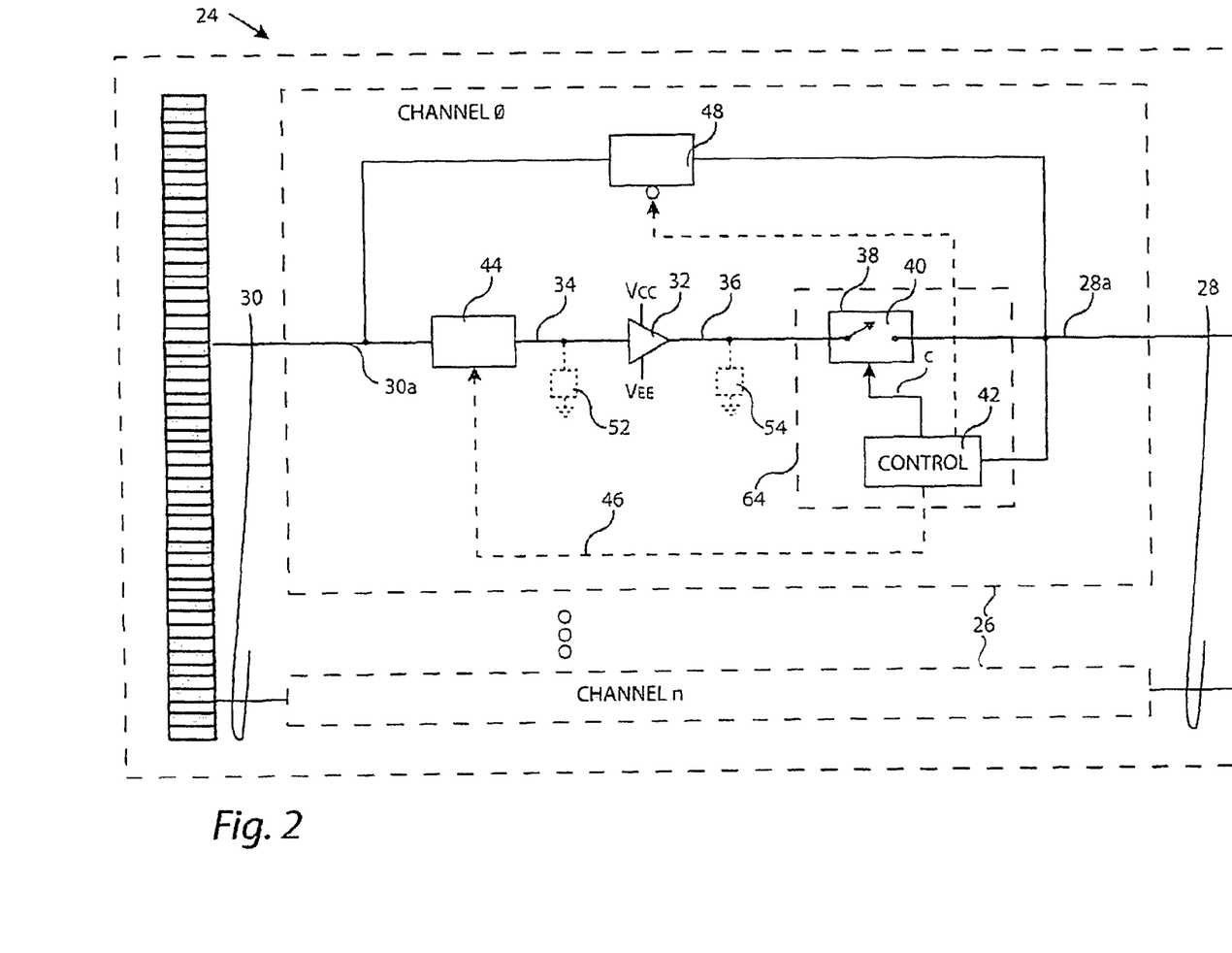
FIG. 2 is a block diagram of an example transducer probe.

FIG. 1 was described in relation to the prior art. FIG. 2 illustrates a transducer probe 24 which is compatible with prior art ultrasound machines, such as the ultrasound machine depicted in FIG. 1. Probe 24 includes a number of channels circuits 26 labeled here as "channel 0" to "channel n." Channel 0 is shown in block diagram form, it being understood that the other channels circuits may be of similar design. Probe 24 may include many channels, e.g. 100-200 channels by way of non-limiting example.

In this example, a multichannel circuit comprises a first plurality of channel ports 28, a second plurality of channel ports 30, and the channel circuits 26. In an example, each of channel circuits includes an amplifier 32 having an input 34 and an output 36. A channel circuit 26 further includes an amplifier output protector 38 including a solid state switch 40 (e.g. one or more transistors) which couples the output 36 of amplifier 32 to a channel port 28a of the first plurality of channel ports 28. The solid state switch 40 has an "open" position wherein its electrical resistance is very high and a "closed" position where its electrical resistance is very low. The channel circuit 26 further includes a controller 42 coupled to channel port 28a and to the output protector 38 by a control line C to control the solid state switch 40.

In an example embodiment, channel circuit 26 further comprises an amplifier input protector 44 coupling a channel port 30a of the second plurality of channel ports 30 to the input 34 of amplifier 32. As can be seen by broken line 46, controller 42 may or may not be used to also control input protector 44.

In another example embodiment, channel circuit 26 further comprises an amplifier bypass 48 coupling port 28a to port 30a, thereby bypassing the amplifier 32. As implied by broken line 50, controller 42 may or may not be employed to control amplifier bypass 48.

Example channel circuit 26 may also optionally include an input shunt 52 coupled between input 34 of amplifier 32 and ground. Still further, example channel circuit 26 can optionally include an output shunt 54 coupled between output 36 and ground. The optional shunts 52 and 54 provide, in certain embodiments, additional protection against over-voltage conditions for the amplifier 32.

Figure 3:
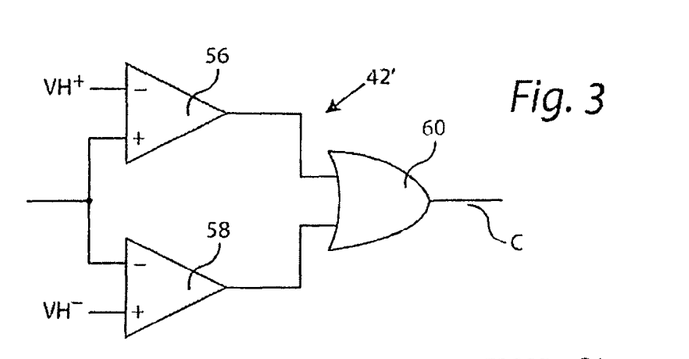
FIG. 3 is a schematic of an example control circuit of the transducer probe of FIG. 2.

FIG. 3 is a schematic of an example controller 42' which may be used in the circuit depicted in FIG. 2. In this example, the controller 42' includes a first comparator 56, a second comparator 58 and an OR gate 60. The "+" input of comparator 56 is coupled to the "−" input of comparator 58, the "−" input of comparator 56 is coupled to a reference voltage VH+, and the "+" input of comparator 58 is coupled to a reference voltage VH−. The outputs of comparators 56 and 58 are coupled to the inputs of OR gate 60. The output of OR gate 60 is coupled to the control line C.

Figure 4:
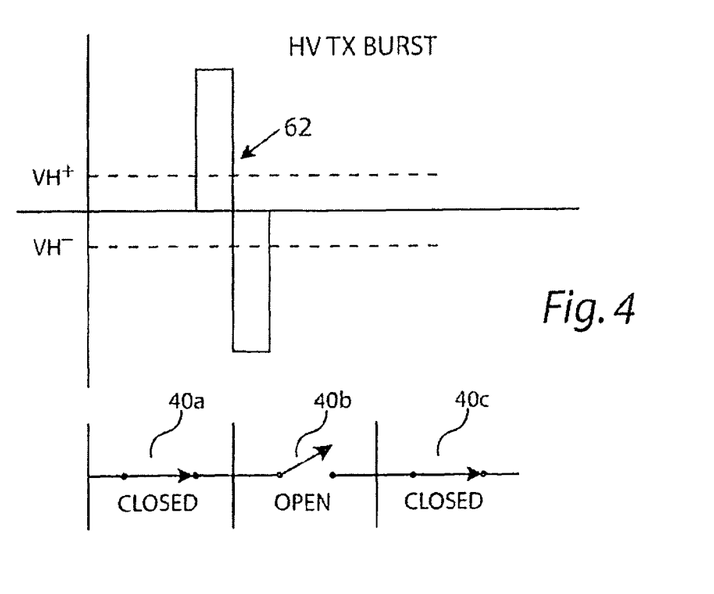
FIG. 4 is a graph illustrating an operation of example control circuit of FIG. 3.

FIG. 4 is graph illustrating an example operation of the circuits depicted in FIGS. 2 and 3. FIG. 4 depicts an HV TX Burst 62 which, as noted previously, can be in the order of 200 volts peak-to-peak. Voltage levels of this magnitude (either positive or negative) would likely damage delicate electronic components such as those found in amplifier 32.

With continuing reference to FIG. 4, when the signal level is less than VH+ but greater than VH−, solid state switch 40 of FIG. 2 will be closed, as indicated at 40a in FIG. 4. However, when the signal level is greater than VH+ or less than VH−, such as during the HV TX Burst 62, the solid state switch 40 of FIG. 2 will open, as indicated at 40b in FIG. 4. After the HV TX Burst 62 is over, switch 40 will again close, as indicated at 40c in FIG. 4

It will therefore be appreciated that controller 42' is, essentially a window voltage detection circuit which detects whether the voltage at port 28a is outside of the "window" of VH+ to VH−. In other embodiments, only a single threshold may be used such that exceeding the threshold causes a switch to open to protect the output of the amplifier.

It will also be appreciated that controller 28a, when coupled with solid state switch 40, serves as a self-resetting circuit breaker which opens under overvoltage conditions and automatically resets when the overvoltage condition is over. In certain embodiments, the controller 28 and the solid state switch 40 are combined, as indicated by box 64 of FIG. 2.

Figure 5:
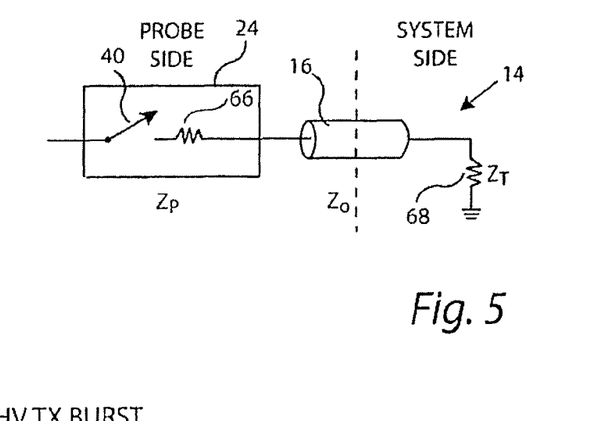
FIG. 5 illustrates impedance matching of a probe, cable and main frame of an example ultrasound machine.

FIG. 5 illustrates the concept of impedance matching with respect to certain example embodiments. The probe 24 is modeled by the solid state switch 40 and a resistor having an impedance Zp, a resistor 68 modeling a main frame 14 having an impedance Zt, and a cable 16 having an impedance Z0. In this example, cable 16 may have an impedance Z0≈75Ω. Probe 24, in this example embodiment, is also designed to have the same impedance Zp. Preferably, the cable 16 is terminated at the main frame 14 with a 75Ω resistor. By matching the impedances of the probe, cable and main frame termination reduces attenuation and reflection in the cable 16.

Figure 6:
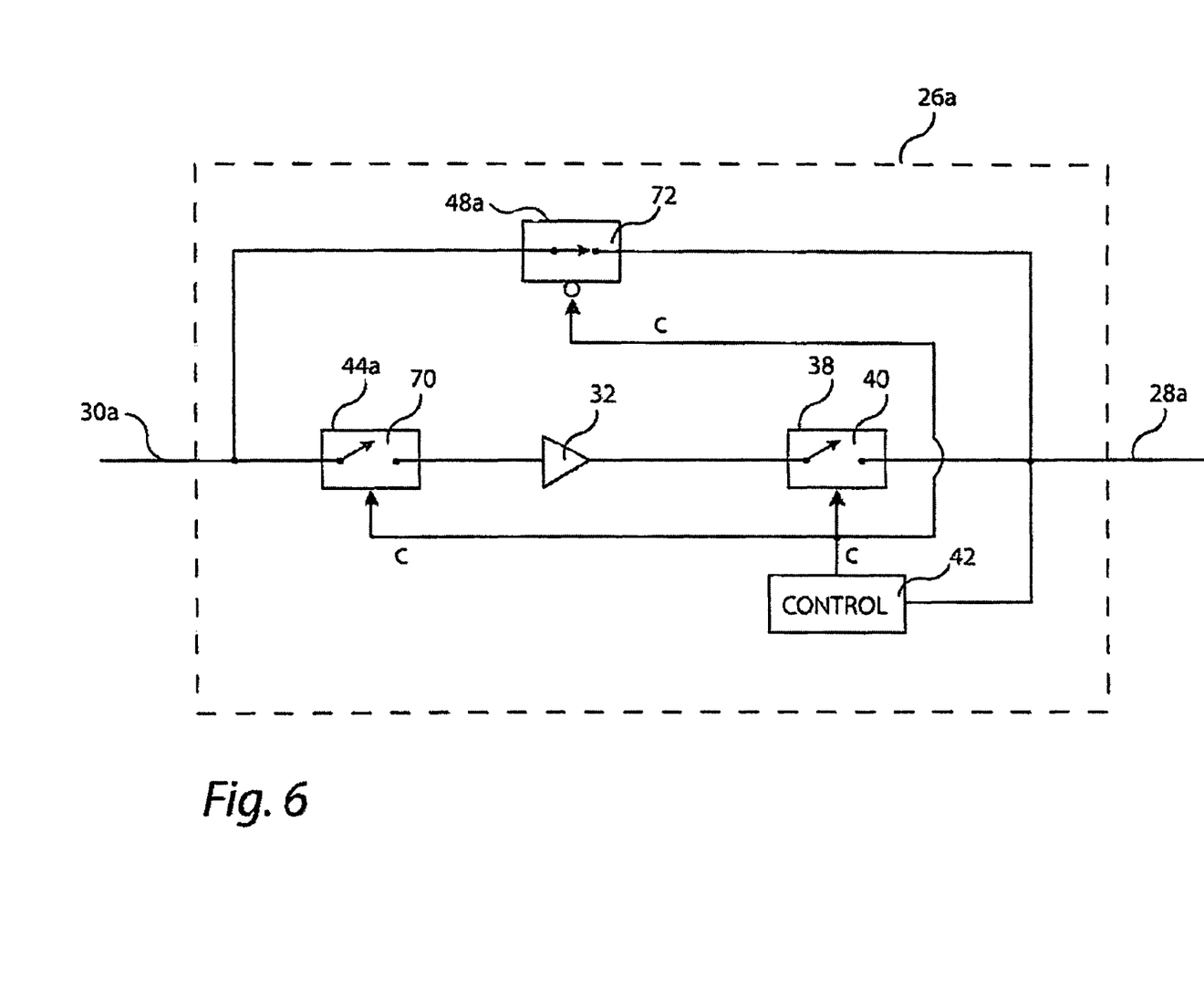
FIG. 6 is a block diagram of another example bidirectional channel circuit.

FIG. 6 is an alternative example of a channel circuit 26a. Like components will be assigned like reference numerals with respect to the channel circuit 26 of FIG. 2. In the embodiment of FIG. 6, amplifier 32, amplifier output protector 38 and controller 42 operate as describe above. Amplifier input protector 44a and amplifier bypass 48a includes solid state switches 70 and 72, respectively, and are controlled by the control line C of controller 42. Note that bypass 48a has an inverted input coupled to control line C such that the solid state switch 72 is always in the opposite state as solid state switches 70 and 40.

In operation, controller determines whether the voltage level on channel port 28a is at a dangerous level. As described previously, there are several ways of determining this. For example, the voltage level on channel port 28a can be compared to a predetermined threshold. In another example, a "window" comparator can be used to see if voltage levels exceed safe values. If the voltage level is considered safe, switches 40 and 70 close and switch 72 to open. This allows echo signals (LV RX Bursts) to travel from port 30a through switch 70, be amplified by amplifier 38, and finally travel through switch 40 and to port 28a in a first direction. If the voltage level is considered to be unsafe (i.e. when a HV TX Burst is at channel port 28a), switches 70 and 40 will be open and switch 72 will be closed. This allows the HV TX Burst travel from the channel port 28a through the bypass 48a and out of channel port 30 in a second direction. When the HV TX Burst is over, the switches return to their previous states.

Figure 7:
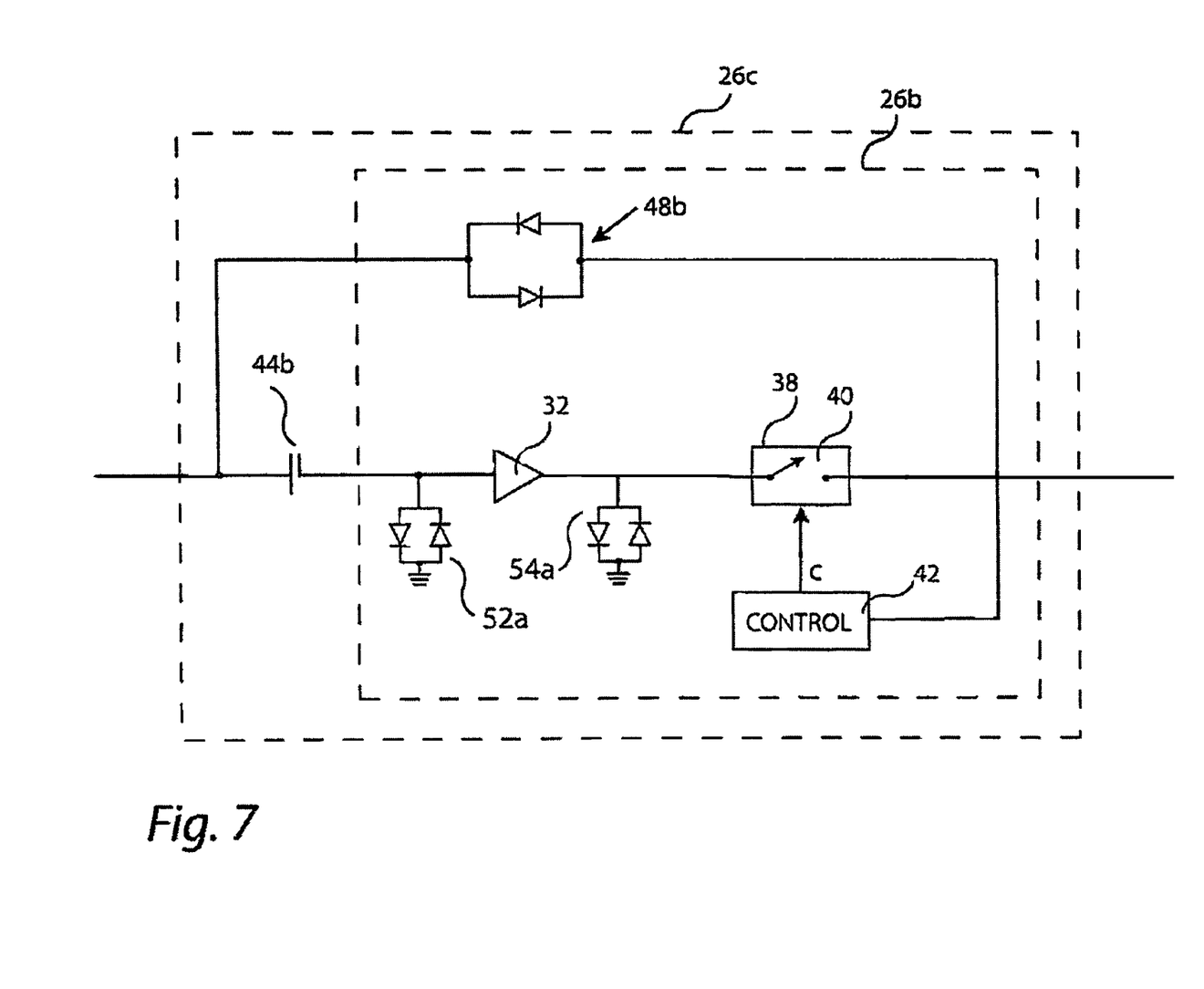
FIG. 7 is a block diagram of yet another example bidirectional channel circuit.

FIG. 7 illustrates several alternative examples of channel circuits 26b and 26c. Like components will use like reference numerals with respect to the channel circuit 26 of FIG. 2 and channel circuit 26a of FIG. 6. The difference between channel circuits 26b and 26c is whether a capacitor 44b is integrated with the other components of the circuit or is external to the other components of the circuit. For example, in an embodiment, channel circuit 26b can be a part of an integrated circuit and the capacitor 44b can be "off chip." In another embodiment, channel circuit 26c can include the capacitor 44b as a part of the integrated circuit.

In the embodiments of FIG. 7, capacitor 44b serves as an amplifier input protector. Shunt 52, which includes a pair of reverse parallel coupled diodes further protect the input of amplifier 32 by shunting the input of the amplifier to ground when the voltage level is greater than about the voltage drop of a diode (e.g. about 0.7 volts). Optional shunt 54a can be provided to similarly protect the output of the amplifier 32 should the switch 40 not open quickly enough. Amplifier bypass 48b is also implemented, in this example, by a pair of reverse parallel coupled diodes.

The embodiments of FIG. 7 operate much as described above. However, only amplifier output protector 28 includes a solid state switch in these embodiments. Therefore, the embodiments of FIG. 7 may be less expensive to implement.

Figure 8:
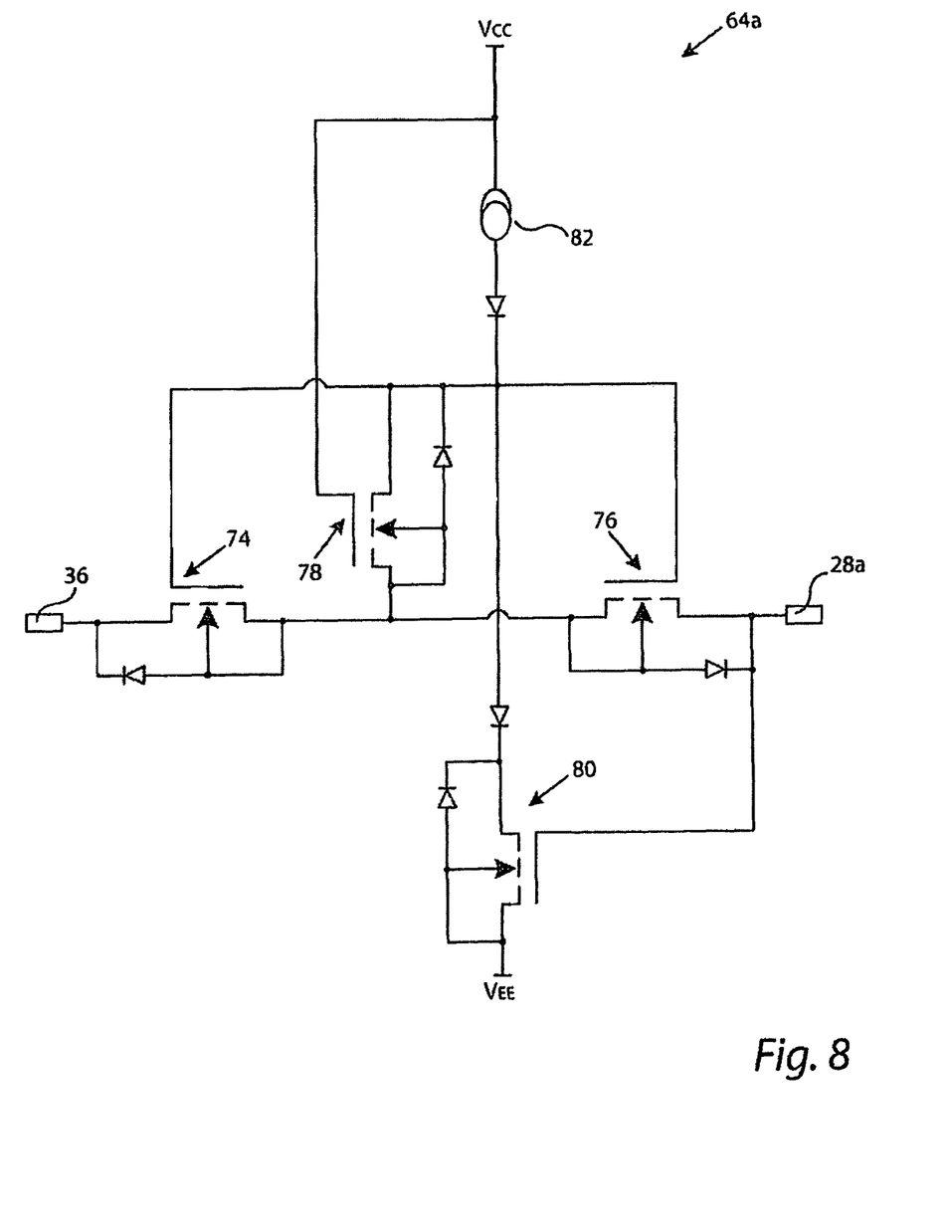
FIG. 8 is a schematic diagram of an example self resetting circuit breaker.

FIG. 8 is a schematic diagram of an example combination controller/amplifier output protector circuit 64a which can operate with the example embodiment of FIG. 2. Circuit 64a can be considered to be a form of solid-state self-resetting circuit breaker. The circuit 64a includes a series connection of a pair of transistors 74 and 76, a first threshold sensing transistor 78 and a second threshold sensing transistor 80. Transistor 76 is coupled to channel port 28a and transistor 74 is coupled to the output 36 of amplifier 32 (not shown). Therefore, both transistors 74 and 76 must be conducting for the "switch" to be "closed" to allow the output 36 to be electrically coupled to the channel port 28a.

It will therefore be appreciated that transistor 74 and 76 implement switch 40, in this example. Vcc can be about +5V and Vee can be about −5V. Transistors 74 and 76 can be fully on when Vgs=Vcc=5V, in this example. Transistors 78 and 80 implement a windows comparator. Transistors 78 and 80 are fully on when their gate/source voltage is 100V but start to be conductive as soon as the Vgs exceed their threshold which can be, for example, Vth=6V. Output 36 is always kept close to ground, while channel port 28a can vary from −100V to +100V.

In operation, when the voltage at channel port 28a is zero, both transistors 78 and 80 are off (Vgs<6V=Vth) and transistors 74 and 76 are fully on because their gates are pulled to Vcc by current source 82. This "closes" switch 40 in the prior examples. When the voltage level on channel port 28a increases by a few volts, transistor 80 begins to conduct which causes transistors 74 and 76 to switch off. Conversely, when the voltage level of channel port 28a drops a few volts, transistor 78 starts to conduct, and transistors 74 and 76 also switch off. This "opens" the switch 40 in the prior examples.

The actual thresholds are set by the value of the current generator 82 and by the size of transistors 78 and 80. This embodiment is advantageous in that it can switch on and off transistors 74 and 76 very fast, providing good protection for the amplifier and good overall circuit performance. This embodiment is also advantageous in that it can provide an impedance of about 75Ω for impedance matching purposes.

Figure 9:
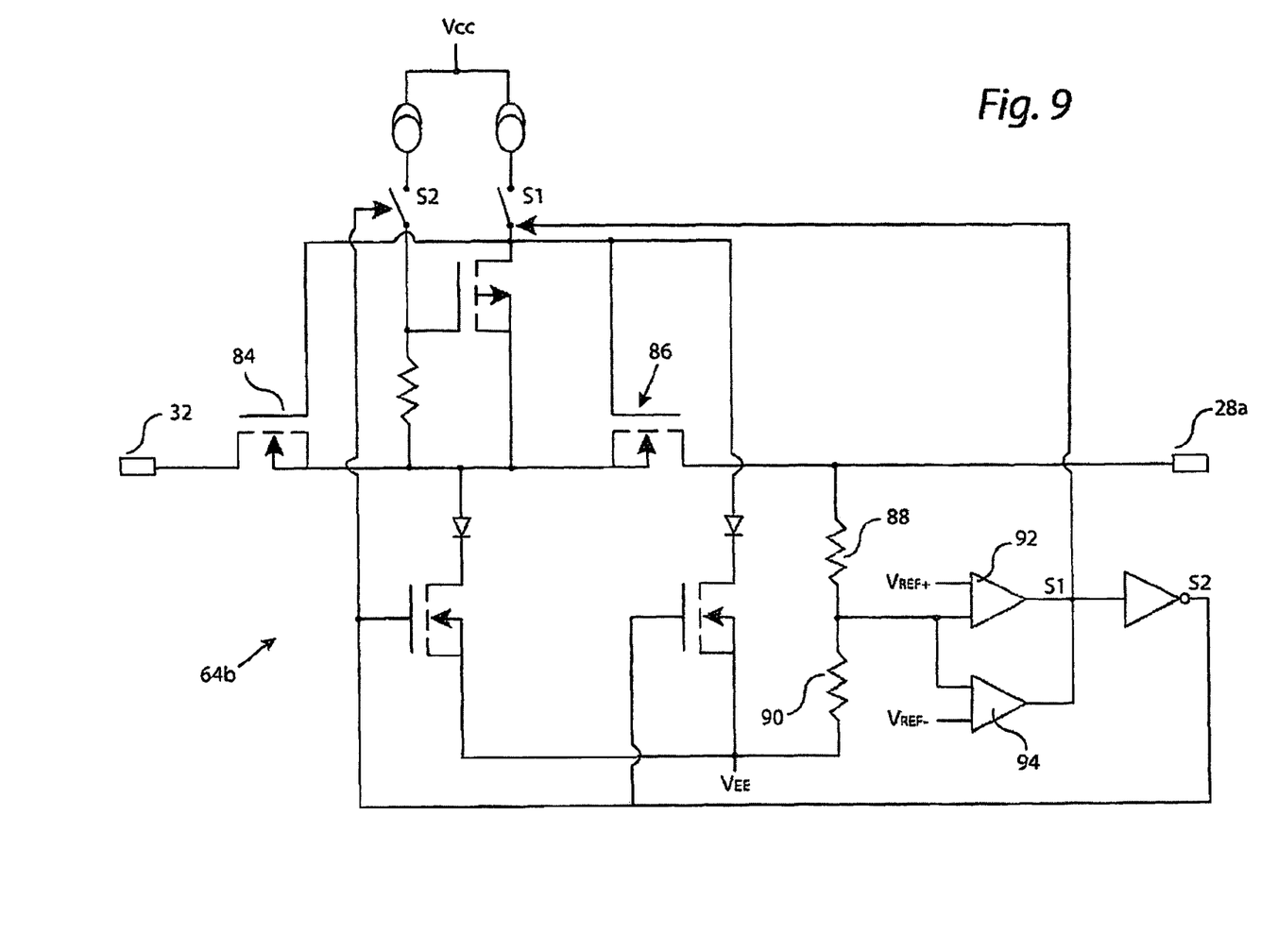
FIG. 9 is a schematic diagram of another example self resetting circuit breaker.

FIG. 9 is a schematic diagram of another example combination controller/amplifier output protection circuit 64b which can operate with the example embodiment of FIG. 2. Circuit 64b can also be considered to be a form of solid-state self-resetting circuit breaker. The circuit 64b includes a series connection of a pair of transistors 84 and 86 coupled between channel port 28a and the output 36 of amplifier 32 (not shown). In this example embodiment, a voltage divider comprising a pair of resistors 88 and 90 reduce a high voltage which may be present at channel port 28a to a lower voltage for comparison to a first reference voltage VREF+ of a first comparator 92 and a second reference voltage VREF− of a second comparator 94. Therefore, in this example, the "window" for voltage detection is VREF+ to VREF−. The comparators 92 and 94 produce signals S1 and S2 to control the transistors and achieve the desired protection for the output 36 of the amplifier 32 against high absolute value voltages at the channel port 28a as described previously.

Figure 10:
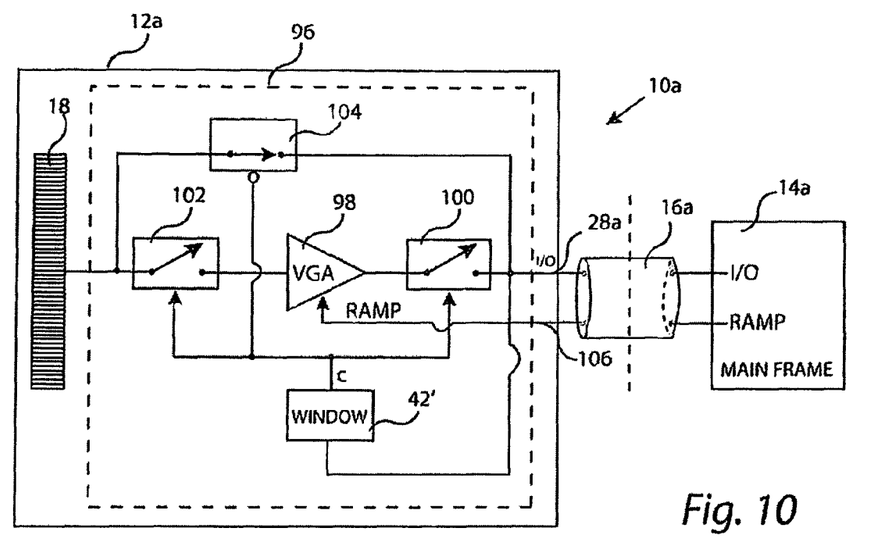
FIG. 10 is a block diagram of an ultrasound machine with example transducer probe having a VGA and high voltage protection.

FIG. 10 is a block diagram of an ultrasound machine 10a with a probe 12a, a main frame 14a and a cable 16a connecting the probe 12a to the main frame 14a. The probe 12a includes a piezoelectric transducer 18. The main frame 14a includes I/O circuitry for sending the HV TX Bursts and for receiving the LV RX Bursts as described previously, and also includes "ramp" circuitry to provide VGA control. As used herein, "ramp", "RAMP" and the like refer to a VGA control signal which can take the form of a number of different waveforms including, but not limited to, the sawtooth waveform discussed by way of non-limiting example with respect to FIG. 11.

The probe 12a of FIG. 10 includes circuitry 96 which can form a part of an integrated circuit (IC) along with, by way of non-limiting example, like circuitry for additional channels. The circuitry 96 includes a variable gain amplifier (VGA) 98, an amplifier output protector 100, an amplifier input protector 102 and an amplifier bypass 104. A window controller, such as controller 42' of FIG. 3, senses the voltage levels at the I/O port 28a and controls the amplifier output protector 100, amplifier input protector 102 and amplifier bypass 104 as described previously. A line 106 of cable 16a is coupled to a control port of VGA 98 to control the gain of the amplifier with, for example, the control signal RAMP. The control signal RAMP on line 106 can be developed, by way of non-limiting example, at the main frame 14a or elsewhere, such as in the probe head.

Figure 11:
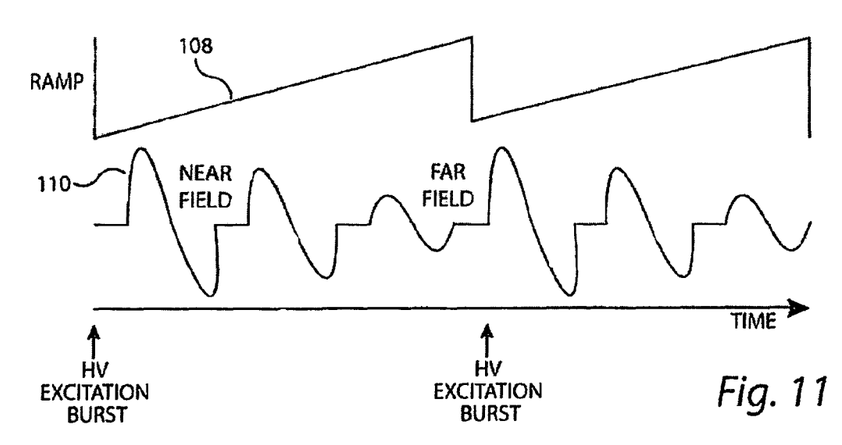
FIG. 11 is graph illustrating a control process for the VGA of FIG. 10.

FIG. 11 is graph illustrating a control process for the VGA 98 of FIG. 10. In this non-limiting example, a waveform 108 for the control signal RAMP is a sawtooth which is triggered at about the time of the generation of a HV TX Burst 110 by the main frame 14a. This may be referred to as the "near field." The duration of the sawtooth is through the resulting echo referred to as the "far field." A new HV TX Burst 110a resets and starts the ramp of the next sawtooth of the waveform 108.

With continuing reference to FIG. 11, it can be seen that the control signal (RAMP) 108 minimizes the gain of VGA 98 at the time of the HV TX Burst 110. As the HB TX Burst subsides and the LV RX Burst ("echo") is generated, the gain of VGA 98 is ramped up to a maximum which coincides with the far field. This provides a better SNR by providing amplification when it is need and dampening amplification during the time of amplifier protection.

Although various embodiments have been described using specific terms and devices, such description is for illustrative purposes only. For example, there are a number of alternative window and threshold detectors known to those of skill in the art. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for bidirectional signal propagation comprising:
    sensing a voltage level of a first signal at a first port with a threshold detector;
    coupling the first port to an output of a variable gain amplifier with a first solid state switch if the voltage level of the first signal is less than a threshold voltage, whereby a second signal applied to a second port coupled to an input of the variable gain amplifier is propagated in a first direction from the second port to the first port;
    bypassing the variable gain amplifier with a second solid state switch if the voltage level of the first signal is greater than the threshold voltage such that the first signal is propagated in a second direction from the first port to the second port, wherein the second port is coupled to the input of the variable gain amplifier by a third solid state switch which is opened when the amplifier is bypassed by the second solid state switch; and
    controlling the gain of the variable gain amplifier with a control signal comprising a ramp signal that is related to the voltage level of the first signal.

2. A method for bidirectional signal propagation comprising:
    sensing a voltage level of a first signal at a first port;
    coupling the first port to an output of a variable gain amplifier with a solid state switch if the voltage level of the first signal is less than a threshold voltage, whereby a second signal applied to a second port coupled to an input of the variable gain amplifier is propagated in a first direction from the second port to the first port through the variable gain amplifier;
    controlling the gain of the variable gain amplifier in a manner related to the voltage level of the first input; and
    bypassing the variable gain amplifier if the voltage level of the first signal is greater than the threshold voltage such that the first signal is propagated in a second direction from the first port to the second port;
    wherein the variable gain amplifier is controlled by a ramp signal.

3. A method for bidirectional signal propagation as recited in claim 2 wherein the voltage level is sensed with a threshold detector.

4. A method for bidirectional signal propagation as recited in claim 2 wherein the threshold voltage is an upper threshold voltage and wherein the voltage level is sensed with window detector which detects whether the voltage level is between a lower threshold voltage and the upper threshold voltage, and whereby the variable gain amplifier is bypassed if the voltage level of the first signal is outside the window between the lower threshold voltage and the upper threshold voltage.

5. A method for bidirectional signal propagation as recited in claim 2 wherein the solid state switch is a first solid state switch and wherein the amplifier is bypassed with a second solid state switch.

6. A method for bidirectional signal propagation as recited in claim 5 wherein the second port is coupled to the input of the amplifier by a third solid state switch which is opened when the amplifier is bypassed by the second solid state switch.

7. A method for bidirectional signal propagation comprising:
    sensing a voltage level of a first signal at a first port;
    coupling the first port to an output of a variable gain amplifier with a solid state switch if the voltage level of the first signal is less than a threshold voltage, whereby a second signal applied to a second port coupled to an input of the variable gain amplifier is propagated in a first direction from the second port to the first port;
    controlling the gain of the variable gain amplifier with a control signal comprising a ramp signal that is related to the voltage level of the first signal; and
    bypassing the variable gain amplifier if the voltage level of the first signal is greater than the threshold voltage such that the first signal is propagated in a second direction from the first port to the second port.

8. A method for bidirectional signal propagation as recited in claim 7 wherein the voltage level is sensed with a threshold detector.

9. A method for bidirectional signal propagation as recited in claim 7 wherein the solid state switch is a first solid state switch and wherein the amplifier is bypassed with a second solid state switch.

10. A method for bidirectional signal propagation as recited in claim 9 wherein the second port is coupled to the input of the amplifier by a third solid state switch which is opened when the amplifier is bypassed by the second solid state switch.

* * * * *